(12) United States Patent
Banno et al.

(10) Patent No.: US 12,006,459 B2
(45) Date of Patent: Jun. 11, 2024

(54) PHOSPHOR POWDER AND LIGHT EMITTING DEVICE

(71) Applicant: DENKA COMPANY LIMITED, Tokyo (JP)

(72) Inventors: Hiroki Banno, Tokyo (JP); Hiroaki Toyoshima, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 18/022,279

(22) PCT Filed: Aug. 10, 2021

(86) PCT No.: PCT/JP2021/029502
§ 371 (c)(1),
(2) Date: Feb. 21, 2023

(87) PCT Pub. No.: WO2022/044793
PCT Pub. Date: Mar. 3, 2022

(65) Prior Publication Data
US 2023/0323201 A1 Oct. 12, 2023

(30) Foreign Application Priority Data
Aug. 25, 2020 (JP) .................. 2020-141749

(51) Int. Cl.
*C09K 11/77* (2006.01)
*F21V 9/30* (2018.01)

(52) U.S. Cl.
CPC .......... *C09K 11/77348* (2021.01); *F21V 9/30* (2018.02)

(58) Field of Classification Search
CPC .......... C09K 11/77348; C09K 11/7728; C09K 11/77; C09K 11/59; C09K 11/0883; C09K 11/592; C09K 11/7731; F21V 9/30; F21V 9/38; F21V 9/45; H01L 33/502; H01L 33/505; Y10T 428/00; F05C 2203/06; F05C 2203/04; F05B 2280/20; F05B 2280/2002; F05B 2280/2003
See application file for complete search history.

(56) References Cited

U.S. PATENT DOCUMENTS 10,738,238 B2  8/2020  Fiedler et al.
11,021,652 B2  6/2021  Fiedler et al.
(Continued)

FOREIGN PATENT DOCUMENTS

JP  2008-230873 A  10/2008
JP  2018-512481 A  5/2018
(Continued)

OTHER PUBLICATIONS

Oct. 19, 2021 International Search Report issued in International Patent Application No. PCT/JP2021/029494.
(Continued)

*Primary Examiner* — Bao Q Truong
(74) *Attorney, Agent, or Firm* — Oliff PLC

(57) ABSTRACT

A phosphor powder of the present invention is a phosphor powder which contains an inorganic compound in which Eu as an activator is solid-soluted in a crystal represented by $Ba_{26}Si_{51}O_2N_{84}$ or in an inorganic crystal having the same crystal structure as the crystal represented by $Ba_{26}Si_{51}O_2N_{84}$, and which is constituted such that in an emission spectrum obtained by irradiating the phosphor powder with excitation light having a wavelength of 450 nm, when a luminescence intensity at a peak wavelength in a range of equal to or more than 750 nm and equal to or less than 950 nm is P0, and when a luminescence intensity at a peak wavelength in a range of equal to or more than 520 nm and equal to or less than 600 nm is P1, $0.01 \leq P1/P0 \leq 0.12$ is satisfied by P0 and P1.

5 Claims, 1 Drawing Sheet

(56) References Cited

U.S. PATENT DOCUMENTS

| | | | | |
|---|---|---|---|---|
| 2013/0215597 | A1* | 8/2013 | Davis | F21V 9/45 362/84 |
| 2018/0044585 | A1 | 2/2018 | Fiedler et al. | |
| 2020/0332182 | A1 | 10/2020 | Fiedler et al. | |
| 2021/0079298 | A1* | 3/2021 | Takeda | C09K 11/7734 |
| 2022/0243126 | A1 | 8/2022 | Hirosaki et al. | |

FOREIGN PATENT DOCUMENTS

| | | | |
|---|---|---|---|
| JP | 6572373 | B1 | 9/2019 |
| JP | 2020-059764 | A | 4/2020 |
| JP | 6684412 | B1 | 4/2020 |
| JP | 2020-83945 | A | 6/2020 |
| WO | 2012/046288 | A1 | 4/2012 |

OTHER PUBLICATIONS

Oct. 19, 2021 International Search Report issued in International Patent Application No. PCT/JP2021/029502.
U.S. Appl. No. 18/022,278, filed Feb. 21, 2023 in the name of Hiroki Banno.
Sep. 14, 2023, U.S. Office Action issued U.S. Appl. No. 18/022,278.
Sep. 12, 2023, Office Action issued in Chinese Application No. 202180051450.1.
Jan. 16, 2024 Notice of Allowance issued in U.S. Appl. No. 18/022,278.

* cited by examiner

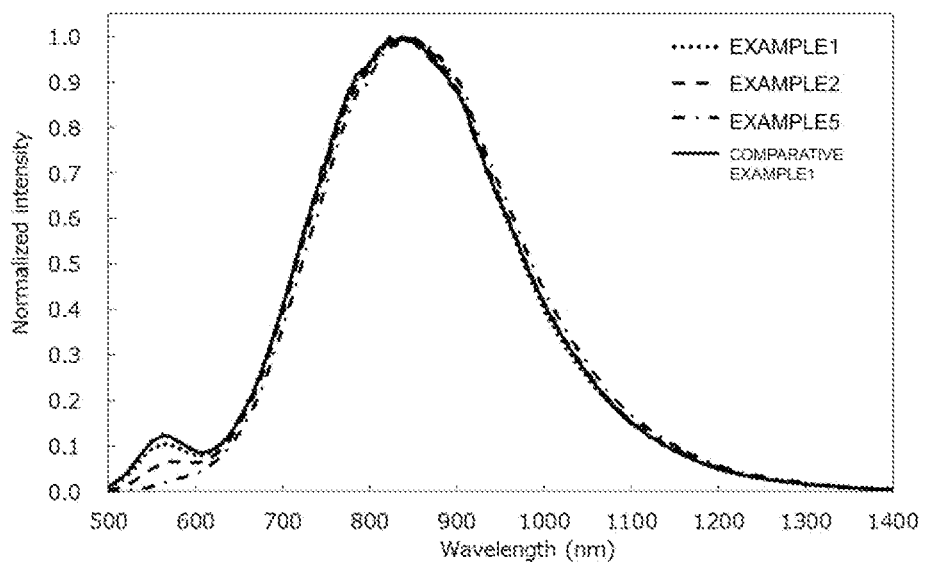

PHOSPHOR POWDER AND LIGHT EMITTING DEVICE

TECHNICAL FIELD

The present invention relates to a phosphor powder and a light emitting device.

BACKGROUND ART

Various developments have been made on $Ba_{26}Si_{51}O_2N_{84}$-based phosphors so far. As this type of technique, a technique disclosed in Patent Document 1 is known, for example. Patent Document 1 discloses that Eu is activated in $Ba_{26}Si_{51}O_2N_{84}$ to emit light of near infrared range (paragraph 0001, Example 1, paragraphs 0090 to 0092, and the like of Patent Document 1).

RELATED DOCUMENT

Patent Document

[Patent Document 1] Japanese Patent No. 6684412

SUMMARY OF THE INVENTION

Technical Problem

However, as a result of examination by the inventors of the present invention, it became clear that in a phosphor powder disclosed in Patent Document 1 containing an inorganic compound in which Eu is activated in a crystal represented by $Ba_{26}Si_{51}O_2N_{84}$, there is room for improvement in terms of luminescence characteristics in order to use the phosphor powder practically.

Solution to Problem

The following findings were obtained by the further examination by the inventors of the present invention.

It was found that in the emission spectrum of the phosphor of $(Ba, Eu)_{26}Si_{51}O_2N_{84}$ when irradiated with excitation light having the wavelength of 450 nm, a main peak is present at 750 nm to 950 nm and a small sub-peak is present near 520 nm to 600 nm, and it was also found that using the luminescence intensity ratio of sub-peak/main peak as an index enables stable evaluation of the luminescence characteristics a phosphor powder, and setting the ratio in a specific range enables to embody the phosphor powder having excellent luminescence characteristics, thereby completing the present invention.

According to the present invention, the following phosphor powder is provided.

A phosphor powder containing an inorganic compound in which Eu as an activator is solid-saluted in a crystal represented by $Ba_{26}Si_{51}O_2N_{84}$ or in an inorganic crystal having the same crystal structure as the crystal represented by $Ba_{26}Si_{51}O_2N_{84}$,
   in which in an emission spectrum obtained by irradiating the phosphor powder with excitation light having a wavelength of 450 nm, when a luminescence intensity at a peak wavelength in a range of equal to or more than 750 nm and equal to or less than 950 nm is P0, and when a luminescence intensity at a peak wavelength in a range of equal to or more than 520 nm and equal to or less than 600 nm is P1, $0.01 \leq P1/P0 \leq 0.12$ is satisfied by P0 and P1.

According to the present invention, the following light emitting device is further provided.

A light emitting device including a light emitting element that emits primary light; and a wavelength conversion body that absorbs a part of the above-mentioned primary light to emit secondary light having a wavelength longer than a wavelength of the primary light,
   in which the above-mentioned wavelength conversion body contains the above-mentioned phosphor powder.

Advantageous Effects of Invention

According to the present invention, a phosphor powder having excellent luminescence characteristics, and a light emitting device are provided.

BRIEF DESCRIPTION OF THE DRAWINGS

FIG. 1 is a graph showing the emission spectra of phosphor powders of Examples 1, 2, and 5 and Comparative Example 1.

DESCRIPTION OF EMBODIMENTS

A phosphor powder of the present embodiment will be described.

The phosphor powder of the present embodiment contains the inorganic compound in which Eu as an activator is solid-soluted in the crystal represented by $Ba_{26}Si_{51}O_2N_{84}$ or in the inorganic crystal having the same crystal structure as the crystal represented by $Ba_{26}Si_{51}O_2N_{84}$.

In the emission spectrum obtained by irradiating the phosphor powder with excitation light having the wavelength of 450 nm, a luminescence intensity at a maximum peak wavelength in the range of equal to or more than 750 nm and equal to or less than 950 nm is P0, and a luminescence intensity at a peak wavelength in the range of equal to or more than 520 nm and equal to or less than 600 nm is P1.

P0 corresponds to the luminescence intensity of the main peak attributed to $(Ba, Eu)_{26}Si_{51}O_2N_{84}$, and P1 corresponds to the luminescence intensity of the sub-peak attributed to $(Ba, Eu)_{26}Si_{51}O_2N_{84}$.

The lower limit of P1/P0 calculated from P0 and P1 is equal to or more than 0.01, preferably equal to or more than 0.02. On the other hand, the upper limit of P1/P0 described above is equal to or less than 0.12, preferably equal to or less than 0.11, for example. By setting P1/P0 in this range, the luminescence intensity of the phosphor powder can be increased.

As above, in the emission spectrum obtained by irradiating the phosphor powder with excitation light having the wavelength of 450 nm, it was found that using the luminescence intensity ratio of sub-peak/main peak attributed to $(Ba, Eu)_{26}Si_{51}O_2N_{84}$ as an index enables stable evaluation of the luminescence characteristics the phosphor powder, and setting the proportion thereof in a specific range enables to embody the phosphor powder having excellent luminescence characteristics.

The phosphor powder has a peak wavelength in the range of equal to or more than 750 nm and equal to or less than 950 nm in the emission spectrum obtained by irradiating the phosphor powder excitation light having the wavelength of 450 nm.

The half-width of the emission spectrum having a peak wavelength in range of equal to or more than 750 nm and equal to or less than 950 nm is equal to or more than 100 nm and equal to or less than 400 nm, preferably equal to or more than 150 nm and equal to or less than 350 nm, and more preferably equal to or more than 200 nm and equal to or less than 300 nm, for example. This makes it possible to increase the luminescence intensity.

The Eu content in the phosphor powder measured by an ICP emission spectrometry is equal to or less than 5.0 mol %, preferably equal to or less than 3.0 mol %, and more preferably equal to or less than 2.0 mol %, for example. In addition, the Eu content may be equal to or more than 0.1 mol %, preferably equal to or more than 0.2 mol %, for example. In an appropriate range, the sub-peak intensity can be reduced.

In the present embodiment, the above-mentioned P1/P0 can be controlled by appropriately selecting a preparation method of the phosphor powder, for example. Among these, examples of factors for setting the above-mentioned P1/P0 within a desired numerical value range include firing a raw material mixture in which Ba is excessively blended, performing an acid treatment on a fired product, and adjusting the amount of Eu and adjusting a particle size.

Regarding the phosphor powder, in a volume frequency particle size distribution measured using a laser diffraction scattering method, the particle size at which the cumulative value is 50% is defined as D50, the particle size at the cumulative value is 10% is defined as D10, and the particle size at which the cumulative value is 90% is defined as D90.

D50 is equal to or more than 1 μm and equal to or less than 50 μm, preferably equal to or more than 5 μm and equal to or less than 45 μm, and more preferably equal to or more than 10 μm and equal to or less than 40 μm, for example. In the above-mentioned range, a balance in luminescence characteristics can be achieved.

The lower limit of ((D90−D10/D50) is equal to or more than 1.00, preferably equal to or more than 1.20, and more preferably equal to or more than 1.30, for example. On the other hand, the upper limit of ((D90−D10)/D50) is equal to or less than 3.00, preferably equal to or less than 2.50, and more preferably equal to or less than 2.00. In the above-mentioned range, a balance in luminescence characteristics can be achieved.

The phosphor powder contains $(Ba, Eu)_{26}Si_{51}O_2N_{84}$ as the main phase of the inorganic compound, and the phosphor powder is preferably constituted so as not to contain a secondary phase such as $Ba_3Si_3O_3N_4$, but may contain a secondary phase as long as the effect of the invention is not impaired.

The present embodiment enables to embody the phosphor powder that can be excited by from ultraviolet light of about 300 nm to 650 nm to visible light, and can emit light having a peak in the near infrared range of 750 nm to 950 nm.

A wavelength conversion body containing the phosphor powder of the present embodiment is configured of a member that converts radiated light (excitation light) and emits light having the light emission peak in the wavelength range different from that of the excitation light. The wavelength conversion body may configure at least a part of a light emitting device described below. The wavelength conversion body may contain one or two or more phosphors other than the phosphor powder of the present embodiment.

The wavelength conversion body may be configured only of the phosphor powder, or may contain a base material in which the phosphor powder has been dispersed. As the base material, known materials can be used, and examples thereof include glass, resins, and inorganic materials. Furthermore, the shape of the wavelength conversion body is not particularly limited, but the wavelength conversion body may be configured in a plate shape, and may be configured to seal a part of a light emitting element or the entire light emitting surface, for example.

The light emitting device as an example containing the phosphor powder of the present embodiment includes the light emitting element that emits primary light, and the wavelength conversion body that absorbs a part of the primary light to emit the secondary light having the wavelength longer than the wavelength of the primary light.

The light emitting device can be used for various usage applications such as sensors, inspection, and analysis use, security use, optical communication use, medical use, and foods, and examples thereof include LED packages, light sources, spectrophotometers, food analyzers, wearable devices, medical and healthcare devices, infrared cameras, moisture measurement devices, and gas detectors.

The phosphor powder of the present embodiment can be manufactured by the following manufacturing method, for example.

An example of the method for manufacturing a phoshor preferably includes a mixing step of obtaining a raw material mixture containing each element constituting the composition of the inorganic compound in which Eu as an activator is solid-soluted in the crystal represented by $Ba_{26}Si_{51}O_2N_{84}$ or in the inorganic crystal having the same crystal structure as the crystal represented by $Ba_{26}Si_{51}O_2N_{84}$; a firing step of firing the raw material mixture to obtain a fired product; and a cleaning step of cleaning-treating the fired product with an acid or water.

Examples of the raw material containing a Ba element include a single substance, a mixture of two or more types, or the like containing Ba and selected from metals, silicides, oxides, carbonates, nitrides, oxynitrides, clorides, fluorides, and oxyfluorides.

Examples of the raw material containing a Si element include a single substance, a mixture of two or more types, or the like containing Si and selected from metals, silicides, oxides, carbonates, nitrides, oxynitrides, chlorides, fluorides, and oxyfluorides.

As the raw material containing an Eu element, a single substance, a mixture of two or more types, or the like containing Eu and selected from metals, silicides, oxides, carbonates, nitrides, oxynitrides, chlorides, fluorides, and oxyfluorides is used.

As the raw material mixture, one that contains a Ba nitride, a Si nitride and/or oxide, or an Eu nitride and/or oxide, for example, may be used. Accordingly, the reaction at the time of firing can be promoted.

In the mixing step, it is preferable that an excessive amount of Ba be blended into the raw material mixture such that b=51 and a/b>(26−c)/51 are satisfied when molar ratios of Ba, Si, and Eu in the starting composition in the raw material mixture are respectively a, b, and c. Specifically, the lower limit of a/b may be more than 0.51, may be equal to or more than or may be equal to or more than 0.60, for example. On the other hand, the upper limit of a/b may be less than 1, may be equal to or less than 0.8, or may be equal to or less than 0.7, for example. By firing the raw material mixture having such a starting composition, secondary phases such as $(Ba, Eu)_3Si_3O_3N_4$ can be reduced.

In addition, it is preferable that the molar ratio of Ba in the starting composition be more than 1.0 times, preferably equal to or more than 1.5 times, more preferably equal to or more than 1.8 times, and further preferably equal to or more than 2.0 times the stoichiometric ratio in the composition represented by General Formula: $(Ba_{1-x}, Eu_x)_{26}Si_{51}O_2N_{84}$.

By firing the raw material mixture having such a starting composition, secondary phases such as (Ba, Eu)$_2$Si$_5$N$_8$ can be reduced.

In the above-mentioned general formula, x, that is, the molar ratio of Eu may be equal to or more than 0.0006, may be equal to or more than 0.001, or may be equal to or more than 0.003, and may be equal to or less than 0.5, may be equal to or less than 0.3, or may be equal to or less than 0.1, for example. In the appropriate range, the sub-peak intensity attributed to (Ba, Eu)$_{26}$Si$_{51}$O$_2$N$_{84}$ in the emission spectrum can be reduced, and the internal quantum efficiency and the external quantum efficiency can be improved.

A method of mixing the raw materials is not particularly limited, but examples thereof include a method of sufficiently mixing using a mixing device such as a mortar, a ball mill, a V-type mixer, a planetary mill, or the like.

Subsequently, the obtained raw material mixture is fired (firing step). Thereby, a reaction product (fired product) after the firing step is obtained.

In the firing step, a firing furnace such as an electric furnace may be used, for example. As an example, the raw material mixture with which the inside of a firing container is filled may be fired.

The firing container is preferably made of a material that is stable under a high temperature atmosphere gas and that is less likely to react with the raw material mixture and the reaction product thereof, and for example, it is preferable to use a container made of boron nitride or carbon, or a container made of a high-melting-point metal such as molybdenum, tantalum, and tungsten.

As the type of firing atmosphere gas in the firing step, for example, a gas containing nitrogen as an element can be preferably used. Specific examples thereof include nitrogen and/or ammonia, where nitrogen is particularly preferable. Similarly, inert gases such as argon and helium can also be preferably used. Among these, nitrogen gas is preferable. The firing atmosphere gas may be composed of one type of gas, or may be a mixed gas of a plurality of types of gas.

The inside of the firing container may be filled with the above-mentioned firing atmosphere gas.

The firing temperature in the firing step is selected in an appropriate temperature range from the viewpoint of reducing unreacted raw materials after the completion of the firing step and preventing decomposition of the main component.

The lower limit of the firing temperature in the firing step is preferably equal to or higher than 1500° C., more preferably equal to or higher than 1600° C., and further preferably equal to or higher than 1700° C. On the other hand, the upper limit of the firing temperature is preferably equal to or lower than 2200° C., more preferably equal to or lower than 2000° C., and further preferably equal to or lower than 1900° C.

The pressure of the firing atmosphere gas is selected according to the firing temperature, but a pressurization state in the range of 0.1 MPa or more and 10 MPa or less is usually used. When considering industrial productivity, the pressure is preferably equal to or more than 0.5 MPa and equal to or less than 1 MPa.

The firing time in the firing step is selected in an appropriate time range from the viewpoint of reducing unreacted products and improving productivity.

The lower limit of the firing time is preferably equal to or longer than 0.5 hours, and more preferably equal to or longer than 1 hour. In addition, the upper limit of the firing time is preferably equal to or shorter than 48 hours, more preferably equal to or shorter than 24 hours, and further preferably equal to or shorter than 16 hours.

Subsequently, the reaction product (fired product) after the firing step may be subjected to a powder treatment in which at least one of pulverization, crushing, and/or sieving is performed (powder treatment step).

The state of the fired product obtained by the firing step varies from powdery to bulky depending on the blending of raw materials and the firing conditions. By the crushing and pulverization step and/or a classification operation step, the fired product can be made into a powder of a predetermined size.

In addition to the above-mentioned steps, a step known in the field of phosphors may be added.

Subsequently, the fired product may be cleaning-treated with an acid or water (cleaning step).

The cleaning step may include a step of bringing the fired product into contact with an acidic solution containing an acid, or water. This makes it possible to reduce secondary phases of (Ba, Eu)$_3$Si$_3$O$_3$N$_4$ while leaving the main phase of (Ba, Eu)$_{26}$Si$_{51}$O$_2$N$_{84}$. In addition, secondary phases such as (Ba, Eu)SiN$_2$ can also be reduced.

For the cleaning treatment, the fired product may be added to an acidic solution or water, or an acid may be added to the fired product in the solution. During the treatment, the acidic solution or water may be left to stand, or may be stirred under appropriate conditions.

In addition, after the acid treatment, decantation (solid-liquid separation treatment) may be performed using water or alcohol, as necessary. The decantation may be performed one time or two or more times. Thereby, the acid can be removed from the fired product by cleaning. Thereafter, the fired product may be filtered, dried, or the like.

For the acid, for example, an inorganic acid may be used, and specific examples thereof include HNO$_3$, HCl, H$_2$SO$_4$, and H$_3$PO$_4$. These may be used alone or may be used in combination of two or more types. Among the inorganic acids, at least one of HNO$_3$ and HCl is preferably contained, and HNO$_3$ is preferably contained.

The acidic solution may contain water or alcohol as a solvent.

The acid concentration in the acidic solution may be 0.1% by mass to 20% by mass, and preferably 0.5% by mass to 10% by mass, for example.

As described above, the phosphor particles of the present embodiment are obtained.

Thereafter, for example, a post treatment such as a crushing and classification treatment, a purification treatment, and a drying treatment may be performed as necessary.

Although the embodiments of the present invention have been described above, these are examples of the present invention, and various configurations other than the above can be adopted. Furthermore, the present invention is not limited to the above-mentioned embodiments, and modifications, improvements, and the like within the scope capable of achieving the object of the present invention are included in the present invention.

EXAMPLES

Hereinafter, the present invention will be described in detail with reference to examples, but the present invention is not limited to the description of these examples.

(Manufacture of Phosphor Powder)

Examples 1 to 5 and Comparative Example 1

As shown in the starting composition in Table 1, in General Formula: (Ba$_{1-x}$, Eu$_x$)$_{26}$Si$_{51}$O$_2$N$_{84}$, x was set to 0.002, 0.005, 0.008, 0.01, and 0.02 in the order of Examples 1 to 5, and barium nitride ($Ba_2N$, manufactured by TAIHEIYO CEMENT CORPORATION), europium oxide ($Eu_2O_3$, manufactured by Shin-Etsu Chemical Co., Ltd.), ($Si_3N_4$, manufactured by UBE INDUSTRIES, LTD.), and silicon oxide ($SiO_2$, manufactured by Kojundo Chemical Lab. Co., Ltd.) were weighed to perform mixing for 10 minutes in a glove box in a nitrogen atmosphere using a pestle and a mortar, which were formed of silicon nitride sintered bodies, thereby obtaining a powdery raw material mixture (mixing step).

In Table 1, the molar ratios of Ba, Si, and Eu in the raw material mixture are respectively represented by a, b, and c.

Subsequently, the raw material mixture was injected into a crucible formed of a boron nitride sintered body. The crucible containing the raw material mixture was put in a graphite resistance heating type electric furnace, the firing atmosphere was set to a vacuum equal to or less than $1\times10^{-1}$ Pa with an oil rotary pump and an oil diffusion pump, heating was performed from room temperature to 600° C. at the rate of 500° C. per hour, nitrogen with the purity of 99.999% by volume was introduced at 600° C. to set the pressure in the furnace to 0.8 MPa, and the temperature was raised to 1800° C. at 600° C. per hour to perform firing for 8 hours (firing step).

The obtained fired product was pulverized in an alumina mortar, and thereafter sieved with a sieve having the aperture of 150 μm (#100 mesh) to recover the powder that had passed through the sieve (powder treatment step).

The fired product in the form of the powder that had passed through the sieve was immersed in 300 ml of nitric acid ($HNO_3$ concentration: 7.5%), and stirred at room temperature for 30 minutes at the stirring speed of 350 rpm (acid treatment step).

Thereafter, removing the supernatant, washing with distilled water, suction filtration, and drying were performed to obtain a phosphor powder.

The obtained fired product and the obtained phosphor powder were evaluated for the following items.

[XRD Measurement]

Diffraction patterns of the phosphor powders obtained in Examples 1 to 5 and Comparative Example 1 were measured using a powder X-ray diffractometer (product name: Ultima IV, manufactured by Rigaku Corporation) under the following measurement condition.

(Measurement Condition)

X-ray source: Cu—Kα ray (λ=1.54184 Å),

Output setting: 40 kV·40 mA

Optical conditions during measurement: divergence slit=⅔°

Scattering slit=8 mm

Light-receiving slit=open

Diffraction peak position=2θ (diffraction angle)

Measurement range: 2θ=10° to 90°

Scanning speed: 2 degrees (2θ)/sec, continuous scanning

Scan axis: 2θ/θ

Sample preparation: the phosphor powder was placed on a sample holder.

The value obtained by performing background correction was defined as the peak intensity.

From the X-ray diffraction pattern results, it was found that the main phase was $Ba_{26}Si_{51}O_2N_{84}$ in the phosphor powders of Examples 1 to 5 and Comparative Example 1.

[Fluorescence Measurement]

(Fluorescence Peak Intensity, Integrated Intensity, Peak Wavelength, and Half-Width)

For the phosphor powders of Examples 1 to 5 and Comparative Example 1, fluorescence peak intensities were measured using a fluorescence spectrophotometer (Fluorolog-3, manufactured by HORIBA, Ltd.) which had been subjected to correction by a secondary standard light source. For the measurement, a square cell holder attached to the spectrophotometer was used so as to be irradiated with excitation light having the wavelength of 450 nm, thereby obtaining an emission spectrum. FIG. 1 shows the emission spectra of the phosphor powders normalized by the peak luminescence intensity in the range of 750 nm to 950 nm. The integrated intensity was calculated by summing the luminescence intensities at 500 nm to 1400 nm, and Table 1 shows the intensity ratio when the integrated intensity in Comparative Example 1 was 100.

In the emission spectrum of the phosphor powders, it was confirmed that a main peak (P0) attributed to the main phase (Ba, $Eu)_{26}Si_{51}O_2N_{84}$ was present near 750 nm to 950 nm, and a sub-peak (P1) attributed to (Ba, $Eu)_{26}Si_{51}O_2N_{84}$ was present in the range of 520 nm to 600 nm.

Table 2 shows the main peak intensity (P0) of each of the phosphor powders, the half-width thereof, the sub-peak intensity (P1), and P1/P0 from the obtained emission spectra when the main peak intensity of Example 3 was 1.00.

TABLE 1

| | starting composition | | | | | |
|---|---|---|---|---|---|---|
| | Chemical composition (molar ratio) | | | | | (26 − |
| Sample | Ba (a) | Eu (c) | Si (b) | O | a/b | c)/51 |
| Example 1 | 31.14 | 0.052 | 51 | 2 | 0.6106 | 0.5088 |
| Example 2 | 31.04 | 0.13 | 51 | 2 | 0.6086 | 0.5073 |
| Example 3 | 30.95 | 0.208 | 51 | 2 | 0.6069 | 0.5057 |
| Example 4 | 30.89 | 0.26 | 51 | 2 | 0.6057 | 0.5047 |
| Example 5 | 30.58 | 0.52 | 51 | 2 | 0.5996 | 0.4996 |
| Comparative Example 1 | 31.18 | 0.013 | 51 | 2 | 0.6115 | 0.5095 |

TABLE 2

| Sample | Peak wavelength (nm) of peak at 750 nm to 950 nm | Half-width (nm) of peak at 750 nm to 950 nm | Luminescence intensity (P1) of peak at 520 nm to 600 nm | Luminescence intensity (P0) of peak at 750 nm to 950 nm | P1/P0 | Integrated intensity ratio |
|---|---|---|---|---|---|---|
| Example 1 | 837 | 263 | 0.10 | 0.90 | 0.11 | 135 |
| Example 2 | 835 | 263 | 0.06 | 0.95 | 0.07 | 141 |
| Example 3 | 840 | 264 | 0.04 | 1.00 | 0.04 | 148 |
| Example 4 | 835 | 264 | 0.04 | 0.88 | 0.04 | 131 |
| Example 5 | 850 | 264 | 0.02 | 0.87 | 0.02 | 128 |
| Comparative Example 1 | 822 | 251 | 0.08 | 0.66 | 0.13 | 100 |

[Particle Size Distribution Measurement]

The particle size distribution of the phosphor powders of Examples 1 to 5 was measured with a particle size distribution analyzer (manufactured by Beckman Coulter, Inc., LS 13 320) of the laser diffraction and scattering method. Water was used as a measurement solvent. A small amount of the phosphor powder was injected to an aqueous solution to which 0.05% by weight of sodium hexametaphosphate had been added as a dispersant, and a dispersing treatment was performed with a horn-type ultrasound homogenizer (output 300 W, horn diameter 26 mm) to measure the particle size distribution. From the obtained volume frequency particle size distribution curve, the 10 vol % diameter (D10), 50 vol % diameter (D50), and 90 vol % diameter (D90) were determined, and thereby the span value of the particle size distribution ((D90−D10)/D50) was determined from the obtained value. Table 3 shows the particle size distribution results.

TABLE 3

| Sample | D10 (μm) | D50 (μm) | D90 (μm) | (D90 − D10)/D50 |
| --- | --- | --- | --- | --- |
| Example 1 | 15.1 | 34.2 | 64.6 | 1.45 |
| Example 2 | 13.2 | 32.3 | 61.9 | 1.51 |
| Example 3 | 16.6 | 37.9 | 71.9 | 1.46 |
| Example 4 | 12.0 | 31.6 | 60.9 | 1.55 |
| Example 5 | 15.5 | 36.2 | 70.8 | 1.53 |

From the results of Examples 1 to 5 and Comparative Example 1, it was found that by setting the peak intensity ratio between the sub-peak and the main peak which are attributed to $(Ba, Eu)_{26}Si_{51}O_2N_{84}$ in an appropriate range, the phosphor powder having excellent luminescence characteristics can be obtained.

This application claims priority on the basis of Japanese Patent Application No. 2020-141749 filed on Aug. 25, 2020, and incorporates all of its disclosures herein.

The invention claimed is:

1. A phosphor powder comprising
an inorganic compound in which Eu as an activator is solid-soluted in a crystal represented by $Ba_{26}Si_{51}O_2N_{84}$ or in an inorganic crystal having the same crystal structure as the crystal represented by $Ba_{26}Si_{51}O_2N_{84}$,
wherein D50 is equal to or more than 1 μm and equal to or less than 50 μm, the D50 is defined as a particle size at which a cumulative value is 50% in a volume frequency particle size distribution curve of the phosphor powder measured by a laser diffraction scattering method using a small amount of the phosphor powder injected to an aqueous solution to which 0.05% by weight of sodium hexametaphosphate added as a dispersant, and performed of a dispersing treatment with a horn-type ultrasound homogenizer to measure the particle size distribution,
wherein in an emission spectrum obtained by irradiating the phosphor powder with excitation light having a wavelength of 450 nm, when a luminescence intensity at a peak wavelength in a range of equal to or more than 750 nm and equal to or less than 950 nm is P0, and when a luminescence intensity at a peak wavelength in a range of equal to or more than 520 nm and equal to or less than 600 nm is P1, $0.01 \leq P1/P0 \leq 0.12$ is satisfied by P0 and P1.

2. The phosphor powder according to claim 1,
wherein in the emission spectrum, a half-width of an emission spectrum having the peak wavelength in the range of equal to or more than 750 nm and equal to or less than 950 nm is equal to or more than 100 nm and equal to or less than 400 nm.

3. The phosphor powder according to claim 1,
wherein a content of the Eu measured by an ICP emission spectrometry is equal to or less than 5.0 mol %.

4. The phosphor powder according to claim 1,
wherein ((D90−D10)/D50) is equal to or more than 1.00 and equal to or less than 3.00, the D10 and D90 are defined as a particle size at which a cumulative value is 50% and 90% respectively in the volume frequency particle size distribution curve of the phosphor powder measured by the laser diffraction scattering method.

5. A light emitting device comprising:
a light emitting element that emits primary light; and
a wavelength conversion body that absorbs a part of the primary light to emit secondary light having a wavelength longer than a wavelength of the primary light,
wherein the wavelength conversion body contains the phosphor powder according to claim 1.

* * * * *